(12) United States Patent
Margeson (10) Patent No.: US 6,803,994 B2
(45) Date of Patent: Oct. 12, 2004

(54) WAVEFRONT ABERRATION CORRECTION SYSTEM

(75) Inventor: Christopher S. Margeson, Sunnyvale, CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/448,633

(22) Filed: May 29, 2003

(65) Prior Publication Data

US 2004/0008433 A1 Jan. 15, 2004

Related U.S. Application Data

(60) Provisional application No. 60/391,114, filed on Jun. 21, 2002.

(51) Int. Cl.[7] ........................... G03B 27/42; G03B 27/54
(52) U.S. Cl. ............................. 355/53; 355/67; 355/71; 359/290; 359/292; 359/872
(58) Field of Search ............................... 355/53, 67–69, 355/71; 359/290, 292, 819, 855, 872

(56) References Cited

U.S. PATENT DOCUMENTS

| 3,904,274 A | 9/1975 | Feinleib et al. |
|---|---|---|
| 4,003,640 A | 1/1977 | Hansen |
| 4,679,915 A | 7/1987 | Kriz et al. |
| 4,737,621 A | 4/1988 | Gonsiorowski et al. |
| 4,875,765 A | 10/1989 | Vandenberg et al. |
| 5,005,961 A | 4/1991 | O'Brien |
| 5,026,977 A | 6/1991 | Hubbard, Jr. |
| 5,037,184 A | 8/1991 | Ealey |
| 5,142,132 A | 8/1992 | MacDonald et al. |
| 5,204,784 A | 4/1993 | Spinhirne |
| 5,229,889 A | 7/1993 | Kittell |
| 5,745,309 A | 4/1998 | Salmon |
| 5,986,795 A * | 11/1999 | Chapman et al. ........... 359/224 |
| 6,053,409 A | 4/2000 | Brobst et al. |
| 6,166,865 A | 12/2000 | Matsuyama |
| 6,229,871 B1 | 5/2001 | Tichenor |
| 6,266,389 B1 | 7/2001 | Murayama et al. |
| 6,398,373 B1 | 6/2002 | Guzman et al. |
| 6,538,829 B2 | 3/2003 | Rau et al. |
| 2001/0026358 A1 | 10/2001 | Van Dijsseldonk |
| 2002/0011573 A1 | 1/2002 | Van Dijsseldonk et al. |

FOREIGN PATENT DOCUMENTS

| EP | 0961149 | 12/1999 |
|---|---|---|
| EP | 1231513 | 8/2002 |
| GB | 2128733 | 5/1984 |
| WO | WO 02/056114 | 7/2002 |

* cited by examiner

*Primary Examiner*—D. Rutledge
(74) *Attorney, Agent, or Firm*—Beyer Weaver & Thomas LLP (57) ABSTRACT

A wavefront aberration correction system for an adaptive optic such as a deformable mirror uses many correction units, each having a force-applying member attached to the back surface of the adaptive optic at a specified position and an actuator connected to it through a force-communicating device. The actuators are disposed outside the perimeter of the adaptive optic. The force-communicating device may include a lever or a bell-crank supported rotatably around a pivot such as a flexural pivot and redirects the force of the actuator.

15 Claims, 5 Drawing Sheets

WAVEFRONT ABERRATION CORRECTION SYSTEM

This application claims priority of U.S. Provisional app. No. 60/391,114 filed on Jun. 21, 2002, which hereby incorporated by reference.

BACKGROUND OF THE INVENTION

This invention is in the technical field of aberration correction for an optical instrument such as a deformable mirror and a deformable lens.

Deformable mirrors with actuators for controlling deformation were disclosed by John Hardy ("Active Optics: A New Technology for the Control of Light," IEEE, Vol. 60, No. 6 (1978)). U.S. Pat. No. 5,037,184 issued Aug. 6, 1991 to Ealey describes a thin-membrane mirror supported directly by many high-stiffness actuators such as PZT actuators. Since commercially available actuators of this kind are at least about 80 mm in length, such actuator attachment mechanisms are not practical in optical designs requiring mirrors and lenses to be disposed with smaller gaps therebetween.

SUMMARY OF THE INVENTION

It is therefore an object of this invention to reduce the amount of space needed to facilitate wavefront aberration correction.

A wavefront aberration correction system embodying this invention for an adaptive optic such as a deformable mirror may be characterized not only as comprising a plurality of correction units each comprising an actuator, a force-applying member attached to the back surface of the adaptive optic at a specified position, and a force-communicating device connecting the actuator with the force-applying member but also wherein the actuator is disposed outside the perimeter of the adaptive optic. With the actuators thus disposed outside the perimeter of the adaptive optic, instead of directly behind its back surface, the envelope size behind can be made compact, allowing for a smaller gap behind the adaptive optic (that is, between two optics) in an optical design. Another advantage of placing the actuators outside the perimeter of the adaptive optic is that thermal effects of the actuators on the adaptive optic can be reduced.

The force-applying members may preferably be a flexure which is stiff only in the direction in which the force is required such that a linear force may be applied to the adaptive optic. The force-communicating device of each correction unit serves to redirect or "bend" the actuating force of the actuator into a direction perpendicular to the back surface of the adaptive optic. For this purpose, the force-communicating device according to this invention may include a lever or an L-shaped bell-crank. It is preferable that the lever or the bell-crank of the force-communicating device be supported rotatably around a flexural pivot.

A method of this invention for correcting wavefront aberration of an adaptive optic may be characterized as providing a correction system as described above and controlling its actuators.

BRIEF DESCRIPTION OF THE DRAWING

The invention, together with further objects and advantages thereof, may best be understood with reference to the following description taken in conjunction with the accompanying drawings in which.

Throughout herein, like components are indicated by the same numerals and may not be repetitiously described even where they are components of different embodiments of the invention.

DETAILED DESCRIPTION OF THE INVENTION

Figure 4:
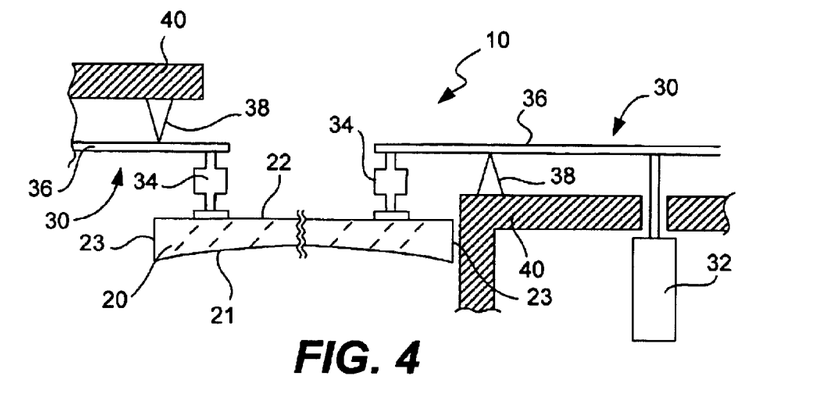
FIG. 4 is a schematic drawing of a wavefront aberration correction system embodying this invention showing two of its correction units.

FIG. 4 shows schematically the structure of a wavefront aberration correction system 10 embodying the invention for an adaptive optic 20 such as a deformable mirror. Throughout herein, however, the term "mirror" is intended to be interpreted in the broadest sense of the word given in dictionaries such as "a surface able to reflect enough undiffused light to form an image of an object placed before it." Thus, the invention is not intended to be limited to systems for wavefront aberration correction of a mirror in any narrower sense of the word excluding lenses.

The adaptive optic 20 has a light-receiving surface 21, a back surface 22 opposite thereto and a perimeter 23, and the correction system 10 consists basically of many correction units 30 (only one of them and partially another of them being shown in FIG. 4) each serving to deform the adaptive optic 20 at a specified surface position. Each of the correction units 30 includes an actuator 32 characterized as being disposed outside the perimeter 23 of the adaptive optic 20, a force-applying member 34 attached to the back surface 22 of the adaptive optic 20 at a specified position and a force-communicating device 36 for communicating the actuating force of the actuator 32 to the specified position on the back surface 22 through the force-applying member 34. The force-applying member 34 and force-communicating device 36 may be a preloaded flexure mechanism adapted to deliver positive and negative force linearly to the adaptive optic 20.

The actuator 32 may be any of many known kinds, although they are not separately illustrated, such as one comprising a stepper motor causing a threaded column engaging with a threaded connector or another comprising a linear motor and a coil.

The force-applying member 34 may be an axial flexure for controlling one degree of freedom of motion. The force-communicating device 36 according to this embodying is a lever supported rotatably around a pivot 38 affixed to a housing 40 of the system 10. One end part of the lever 36 is connected to the actuator 32, and the actuating force of the actuator 32 is applied to the lever 36 in a direction perpendicular to the back surface 22 of the adaptive optic 20, causing it to rotate around the pivot 38. The force-applying member 34 is connected to the lever 36 at another position such that the actuating force of the actuator 32 is communicated through the lever 36 to the force-applying member 34, serving to deform the adaptive optic 20 at its contacting position therewith.

Although FIG. 4 shows an example wherein the actuator 32 and the force-applying member 34 are connected to the lever 36 at positions on mutually opposite side of the pivot 38, they may be arranged such that the actuator 32 and the force-applying member 34 are connected to the lever 36 at positions on the same side of the pivot 38. In either case, it is preferable that the position at which the actuating force of the actuator 32 be applied to the lever 36 at a position farther removed from the pivot 38 than the position at which the force-applying member 34 is connected to the lever 36. It is because the force applied onto the adaptive optic 20 can be controlled more precisely. It is also preferable that the lever 36 be made of a flexible material such that the actuator 32, together with the flexible lever 36, can function as a force actuator and the problem of overconstraining the adaptive optic 20 can be obviated.

Figure 5:
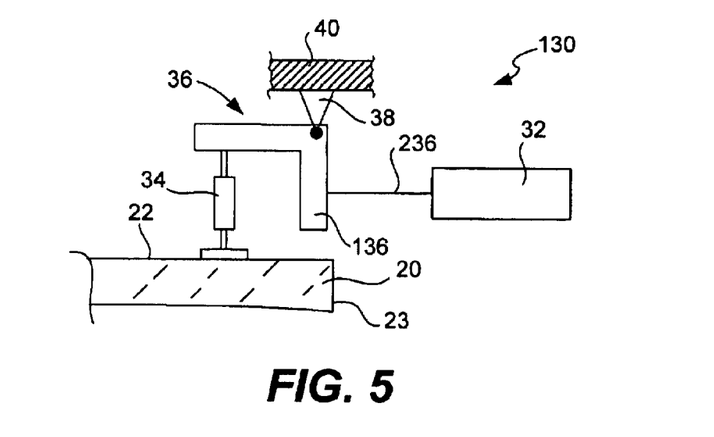
FIG. 5 is a schematic drawing of another correction unit.

FIG. 5 shows schematically the structure of another correction unit 130 forming a part of another wavefront aberration correction system embodying the invention. This correction unit 130 also comprises an actuator 32, a force-applying member 34 and a force-communicating device 36 for communicating the actuating force of the actuator 32 to a specified position on the back surface 22 through the force-applying member 34 but is different from the correction unit 30 explained above with reference to FIG. 4 wherein its force-communicating device 36 includes a bell-crank 136, or an L-shaped component supported rotatably around a pivot 38 and having two branches extending perpendicularly therefrom. One of the branches is connected to the actuator 32 through a push rod (or cable) 236 and the force-applying member 34 is connected to the other branch.

Thus, the actuating force of the actuator 32 is communicated through the push rod 236 (or cable, but the force-applying member should be preloaded if a cable is used instead of a rod) to the bell-crank 136 in a direction parallel to the back surface 22 of the adaptive optic 20 but this causes the bell-crank 136 to rotate around the pivot 38 and the other branch of the bell-crank 136 applies a force perpendicular to the back surface 22 of the adaptive optic 20 through the force-applying member 34.

Figure 6:
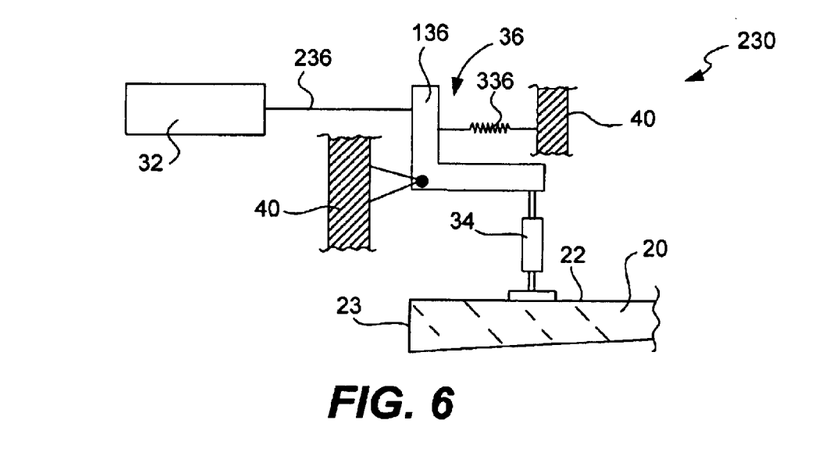
FIG. 6 is a schematic drawing of still another correction unit.

FIG. 6 shows schematically the structure of still another correction unit 230 forming a part of still another wavefront aberration correction system embodying the invention. This correction unit 230 may be regarded as a variation of the unit 130 described above with reference to FIG. 5 but is different therefrom only in that the direction in which the bell-crank 136 is supported is different and that the force-communicating device 36 in this example is preloaded. The preload is shown in FIG. 6 in the form of a spring 336 connecting a selected part of the bell-crank 136 to the housing 40, but the force-communicating device 36 may be preloaded in different manners. Such a preload may be designed not only into the bell-crank 136 but also into the lever 36 of FIG. 4 or even into the pivot 38. Although FIGS. 4–6 illustrate the pivot 38 only schematically, the pivot 38 may be a flexural pivot and may be provided with bearings.

It is to be noted that the actuators 32 in the examples shown in FIGS. 5 and 6 are also disposed outside the perimeter 23 of the adaptive optic 20. Adaptive optics are often used to correct thermally induced aberrations in the wavefront of an optical system. By removing the actuators from the immediate area behind (and in contact with) the adaptive optic, no additional thermal influences are introduced. By placing actuators and moving mechanical parts outside the perimeter of the optic, it is easier to seal the moving parts in particular for vacuum applications.

Figure 1A:
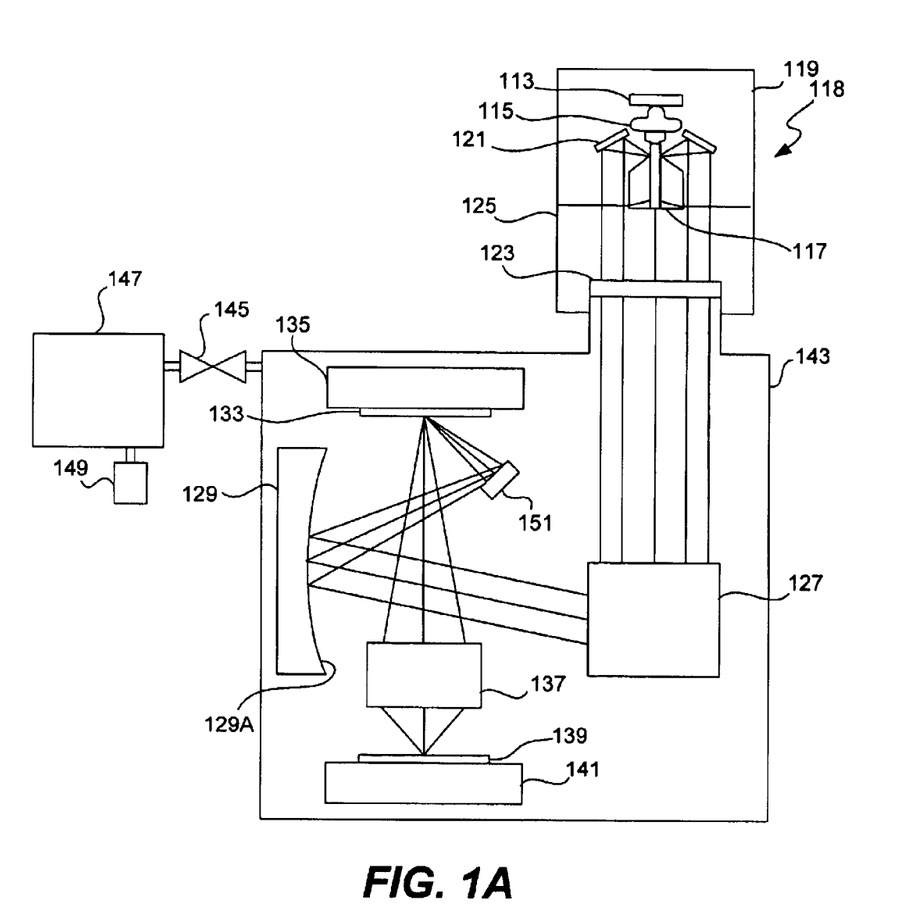
FIG. 1A is a schematic optical diagram of a representative embodiment of an X-ray microlithography system comprising at least one multilayer-film reflective optical element according to any of the embodiments of this invention.

FIG. 1A shows an EUV (or soft-X-ray SXR) system 110, including the EUV mirror of this invention as described above. As a lithographic energy beam, the EUV system 110 uses a beam of EUV light of wavelength $\lambda=13$ nm. The depicted system is configured to perform microlithographic exposures in a step-and-scan manner.

The EUV beam is produced by a laser-plasma source 117 excited by a laser 113 situated at the most upstream end of the depicted system 110. The laser 113 generates laser light at a wavelength within the range of near-infrared to visible. For example, the laser 113 can be a YAG laser or an excimer laser. Laser light emitted from the laser 113 is condensed by a condensing optical system 115 and directed to the downstream laser-plasma source 117. Upon receiving the laser light, the laser-plasma source 117 generates SXR (EUV) radiation having a wavelength ($\lambda$) of approximately 13 nm with good efficiency.

A nozzle (not shown), disposed near the laser-plasma source 117, discharges xenon gas in a manner such that the discharged xenon gas is irradiated with the laser light in the laser-plasma source 117. The laser light heats the discharged xenon gas to a temperature sufficiently high to produce a plasma that emits photons of EUV light as the irradiated xenon atoms transition to a lower-potential state. Since EUV light has low transmittance in air, the optical path for EUV light propagating from the laser-plasma source 117 is contained in a vacuum chamber 119 normally evacuated to high vacuum. Since debris normally is produced in the vicinity of the nozzle discharging xenon gas, the vacuum chamber 119 desirably is separate from other chambers of the system.

A parabolic mirror 121, coated with a Mo/Si multilayer film, is disposed relative to the laser-plasma source 117 so as to receive EUV light radiating from the laser-plasma source 117 and to reflect the EUV light in a downstream direction as a collimated beam. The multilayer film on the parabolic mirror 121 is configured to have high reflectivity for EUV light of which $\lambda=$approximately 13 um.

The collimated beam passes through a visible-light-blocking filter 123 situated downstream of the parabolic mirror 121. By way of example, the filter 123 is made of Be, with a thickness of 0.15 nm. Of the EUV radiation reflected by the parabolic mirror 121, only the desired 13-nm wavelength of radiation passes through the filter 123. The filter 123 is contained in a vacuum chamber 125 evacuated to high vacuum.

An exposure chamber 143 is disposed downstream of the filter 123. The exposure chamber 143 contains an illumination-optical system 127 that comprises a condenser mirror and a fly-eye mirror (not shown, but well understood in the art). The illumination-optical system 127 also is configured to trim the EUV beam (propagating from the filter 123) to have an arc-shaped transverse profile. The shaped "illumination beam" is irradiated toward the left in the figure.

A circular, concave mirror 129 is situated so as to receive the illumination beam from the illumination-optical system 127. The concave mirror 129 has a parabolic reflective surface 129a and is mounted perpendicularly in the vacuum chamber 143. The concave mirror 129 comprises, for example, a quartz mirror substrate of which the reflection surface is machined extremely accurately to the desired parabolic configuration. The reflection surface of the mirror substrate is coated with a Mo/Si multilayer film so as to form the reflective surface 129a that is highly reflective to EUV radiation of which λ=13 nm. Alternatively, for other wavelengths in the range of 10–15 nm, the multilayer film can be of a first substance such as Ru (ruthenium) or Rh (rhodium) and a second substance such as Si, Be (Beryllium) or $B_4C$ (carbon tetraboride).

A mirror 131 is situated at an angle relative to the concave mirror 129 so as to received the EUV beam from the concave mirror 129 and direct the beam at a low angle of incidence to a reflective reticle 133. The reticle 133 is disposed horizontally so that its reflective surface faces downward in the figure. Thus, the beam of EUV radiation emitted from the illumination-optical system 127 is reflected and condensed by the concave mirror 129, directed by the mirror 131, and focused don the reflective surface of the reticle 133.

The reticle 133 includes a multilayer film so as to be highly reflective to incident EUV light. A reticle pattern, corresponding to the pattern to be transferred to a substrate 139, is defined in an EUV-absorbing layer formed on the multiplayer film of the reticle 133, as discussed later below. The reticle 133 is mounted to a reticle stage 135 that moves the reticle 133 at least in the Y direction. The reticle 133 normally is too large to be illuminated entirely during a single exposure "shot" of the EUV beam. As a result of the mobility of the reticle stage 135, successive regions of the reticle 133 can be irradiated sequentially so as to illuminate the pattern in a progressive manner with EUV light from the mirror 131.

Figure 1B:
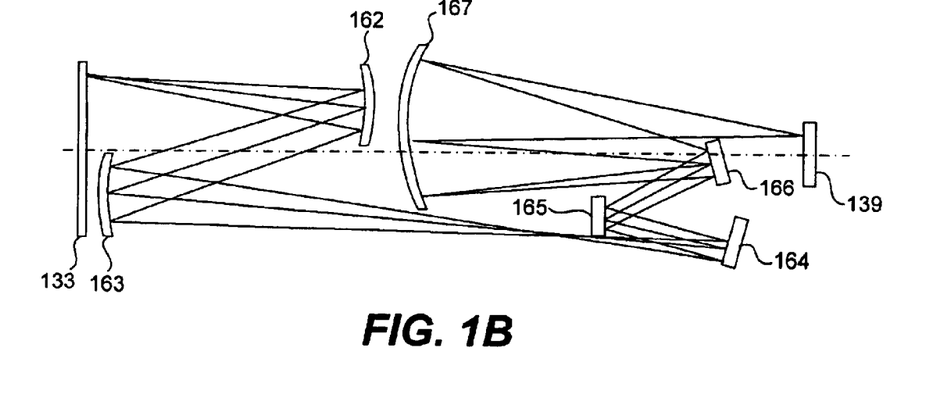
FIG. 1B is a detailed view of the projection-optical system of the microlithography system shown in FIG. 1A.

A projection-optical system 137 and substrate (such as a semiconductor wafer) 139 are disposed in that order downstream of the reticle 133. The projection-optical system 137 comprises multiple multilayer-film reflective mirrors that collectively demagnify an aerial image of the illuminated portion of the pattern on the reticle 133. The demagnification normally is according to a predetermined demagnification factor such as ¼. The projection-optical system 137 focuses an aerial image of the illuminated pattern portion onto the surface of the substrate 139. Meanwhile, the substrate 139 is mounted to a substrate stage 141 that is movable in the X, Y, and Z directions.

Connected to the exposure chamber 143 via a gate valve 145 is a preliminary-evacuation ("load-lock") chamber 147. The load-lock chamber 147 allows exchanges of the reticle 133 and/or substrate 139 as required. The load-lock chamber 147 is connected to a vacuum pump 149 that evacuates the load-lock chamber 147 to a vacuum level substantially equal to the vacuum level inside the exposure chamber 143.

During a microlithographic exposure, EUV light from the illumination-optical system 127 irradiates the reflective surface of the reticle 133. Meanwhile, the reticle 133 and substrate 139 are moved by their respective stages 135 and 141 in a synchronous manner relative to the projection-optical system 137. The stages 135 and 141 move the reticle 133 and the substrate 139, respectively, at a velocity ratio determined by the demagnification factor of the projection-optical system 137. Thus, the entire circuit pattern defined don the reticle 133 is transferred, in a step-and-scan manner, to one or more "die" or "chip" locations on the substrate 139. By way of example, each "die" or "chip" on the substrate 139 is a square having 25-mm sides. The pattern is thus "transferred" from the reticle 133 to the substrate at very high resolution (such as sufficient to resolve a 0.07-$\mu m$ line-and-space (L/S) pattern). So as to be imprintable with the projected pattern, the upstream-facing surface of the substrate 139 is coated with a suitable "resist."

In the system 110 of FIG. 1A at least one multilayer-film optical element as described above is included in at least one of the illumination-optical system 127, the reticle 133, and the projection-optical system 137.

Figure 1C:
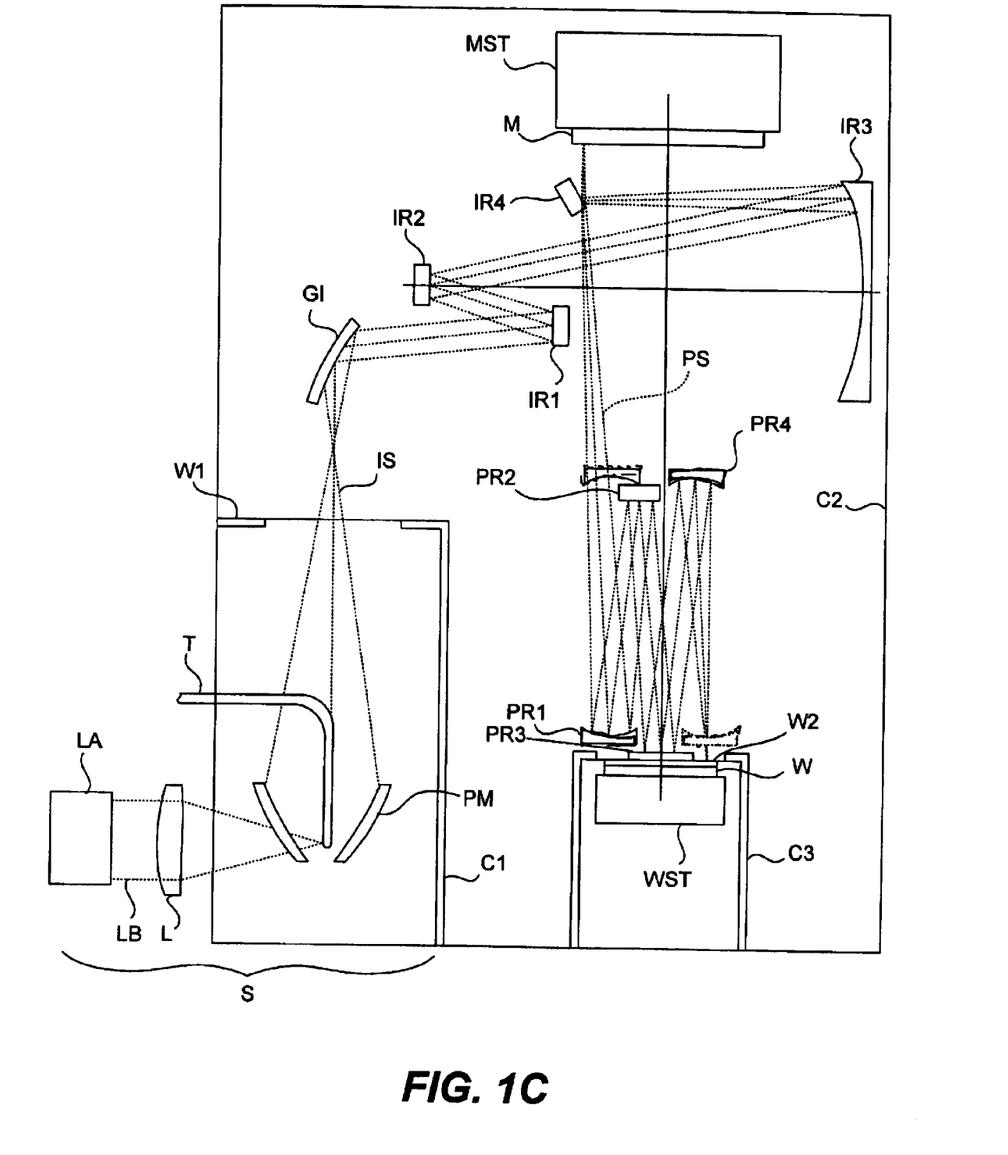
FIG. 1C is a schematic optical diagram of another representative embodiment of an X-ray microlithography system comprising at least one multilayer-film reflective optical element (including a reflective reticle) according to any of the embodiments of this invention.

FIG. 1C shows another embodiment of an X-ray (specifically EUV) microlithography system utilizing one or more multilayer-film reflective optical elements as described herein and comprising a EUV source S, an illumination-optical system (comprising elements GI and IR1–IR4), a reticle stage MST for holding a reticle M, a projection-optical system (comprising elements PR1–PR4) and a substrate stage WST for holding a substrate W (such as a semiconductor wafer).

The EUV source S generates an illumination beam IB of EUW light. To such end, a laser LA generates and directs a high-intensity laser beam LB (near-IR to visible) through a lens L to the discharge region of a nozzle T that discharges a target substance such as xenon. The irradiated target substance forms a plasma that emit photons of EUV light that constitute the illumination beam IB. The illumination beam IB is reflected by a parabolic multilayer-film mirror PM to a window W1. The EUV source S is contained in a chamber C1 that is evacuated to a suitably high vacuum by means of a vacuum pump (not shown). The illumination beam IB passes through the window W1 to the interior of an optical-system chamber C2.

The illumination beam IB then propagates to the illumination-optical system comprising mirrors GI, IR1, IR2, IR3 and IR4. The mirror GI is a grazing-incidence mirror that reflects the grazing-incident illumination beam IB from the EUV source S. (Alternatively, the mirror GI can be a multilayer-film mirror.) The mirrors IR1, IR2, IR3 and IR4 are multilayer-film mirrors each including a surface multilayer film exhibiting high reflectivity to incident EUV radiation, as described elsewhere herein. The illumination-optical system also comprises a filter (not shown) that is transmissive only to EUV radiation of a prescribed wavelength. The illumination-optical system directs the illumination beam IB, having the desired wavelength, to a selected region on the reticle M. The reticle M is a reflective reticle including a multilayer film. The beam reflected from the reticle M carries an aerial image of the illuminated region of the reticle M; hence the reflected beam is termed a patterned beam.

The protection-optical system comprises multiple multilayer-film mirrors PR1, PR2, PR3 and PR4 that collectively project an image of the illuminated portion of the reticle M onto a corresponding location on the substrate W. Thus, the pattern defined by the reticle M is transfer-exposed onto the substrate W. Note that several of the mirrors PR1–PR4 (specially the mirrors PR1 and PR4) have a cutout allowing the patterned beam unobstructed passage in the projection-optical system. So as to be imprintable with the projected pattern, the substrate W is coated with an exposure-sensitive resist. Since EUV radiation is absorbed and attenuated in the atmosphere, the environment in the optical-system chamber C2 is maintained at a suitably high vacuum (such as $10^{-5}$ Torr or less). Actual exposure of the substrate W can be performed in a "step-and-repeat," "step-and-scan," or pure s canning-exposure manner, or other suitable manner, all of which involving controlled movements of the reticle stage MST and substrate stage WST relative to each other as transfer-exposure of the pattern progresses. During exposure, the substrate W is situated in a separate chamber C3, termed a "substrate chamber" or "wafer chamber," that contains the substrate stage WST. As the patterned beam PB enters the substrate chamber C3 from the optical-system chamber C2, the beam passes through a window W2.

Wavefront aberration must be controlled so as to satisfy a given specification but a wavefront aberration correction system of this invention can be used to a correct such wavefront aberration errors. Wavefront aberration can be measured either in situ or outside the system. A device for measuring wavefront aberration of a EUV projection-optical system is described, for example, in the U.S. Pat. No. 6,266,389 issued Jul. 24, 2001, which is herein incorporated by reference. The surface shape of a mirror is varied such that the measured wavefront aberration comes to satisfy the given specification but it is not necessary to vary the surface configurations of all of the mirrors. It is sufficient if the surface configuration of at least one of the mirrors is made adjustable. A method of obtaining the final surface configuration of the mirror from the measured wavefront aberration is also described in aforementioned U.S. Pat. No. 6,266,389.

Figure 2:
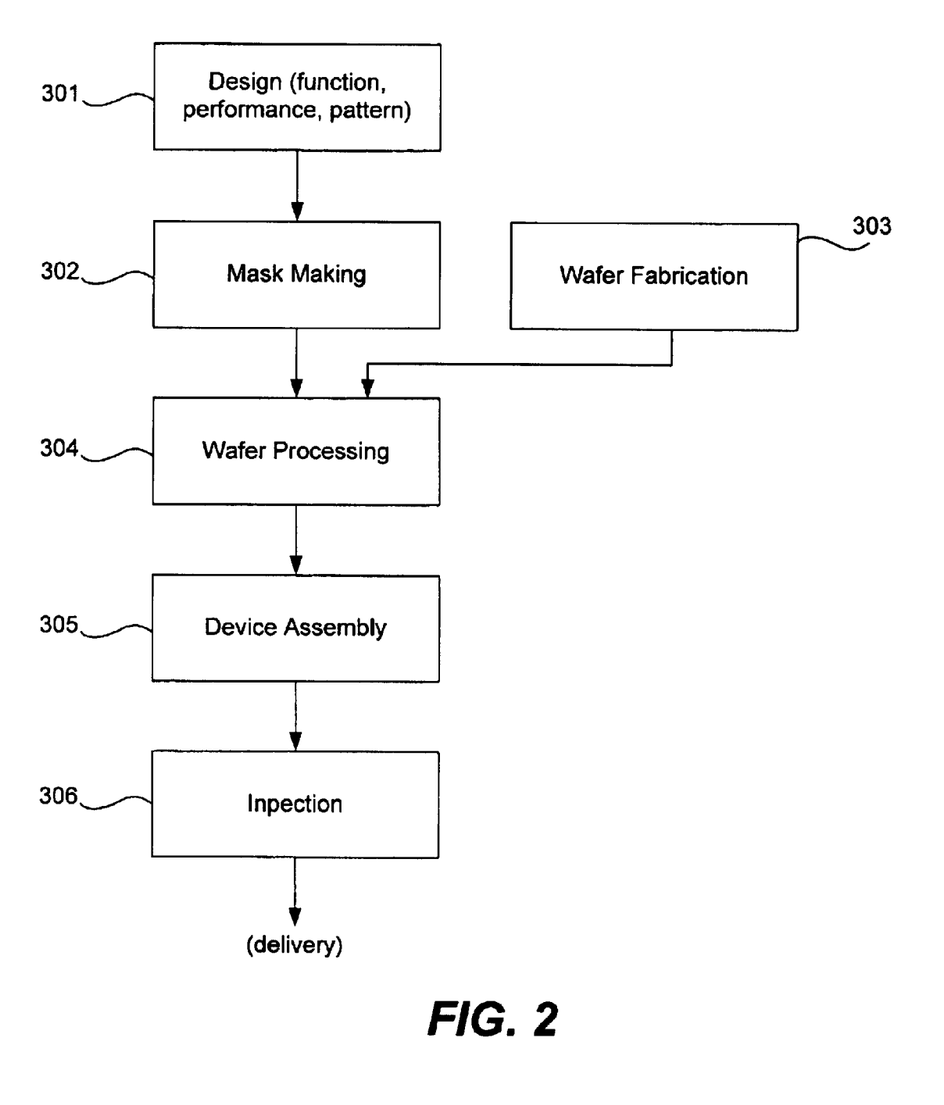
FIG. 2 is a process flow diagram illustrating an exemplary process by which semiconductor devices are fabricated by using the apparatus shown in FIG. 1 according to the present invention.

Further, semiconductor devices can be fabricated using the above described systems, by the process shown generally in FIG. 2. In step 301 the device's function and performance characteristics are designed. Next, in step 302, a mask (reticle) having a pattern is designed according to the previous designing step, and in a parallel step 303, a wafer is made from a silicon material. The mask pattern designed in step 302 is exposed onto the wafer from step 303 in step 304 by a photolithography system such as the systems described above. In step 305 the semiconductor device is assembled (including the dicing process, bonding process and packaging process), then finally the device is inspected in step 306.

Figure 3:
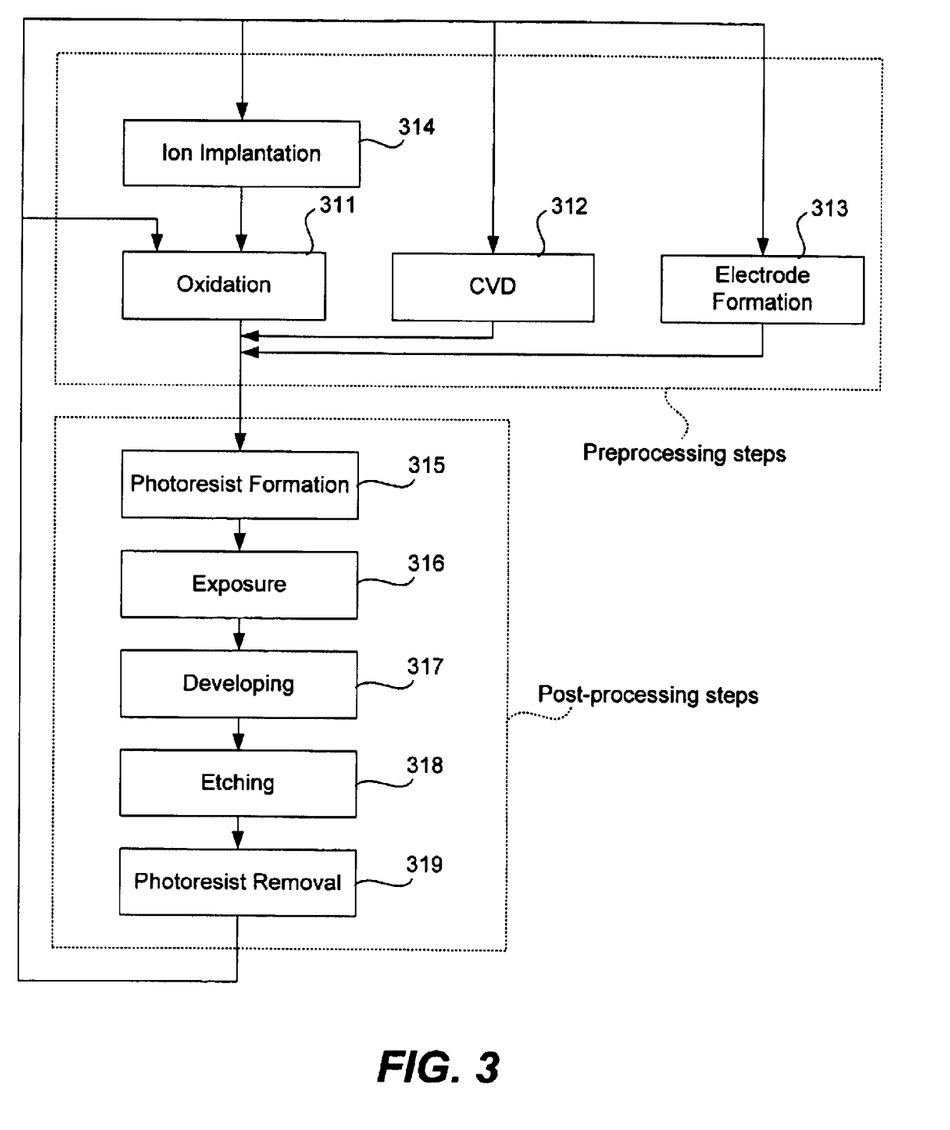
FIG. 3 is a flowchart of the wafer processing step shown in FIG. 2 in the case of fabricating semiconductor devices according to the present invention.

FIG. 3 illustrates a detailed flowchart example of the above-mentioned step 304 in the case of fabricating semiconductor devices. In step 311 (oxidation step), the wafer surface is oxidized. In step 312 (CVD step), an insulation film is formed on the wafer surface. In step 313 (electrode formation step), electrodes are formed on the wafer by vapor deposition. In step 314 (ion implantation step), ions are implanted in the wafer. The above mentioned steps 311–314 form the preprocessing steps for wafers during wafer processing, and selection is made at each step according to processing requirements.

At each stage of wafer processing, when the above-mentioned preprocessing steps have been completed, the following post-processing steps are implemented. During post-processing, initially, in step 315 (photoresist formation step), photoresist is applied to a wafer. Next, in step 316, (exposure step), the above-mentioned exposure device is used to transfer the circuit pattern of a mask (reticle) to a wafer. Then, in step 317 (developing step), the exposed wafer is developed, and in step 318 (etching step), parts other than residual photoresist (exposed material surface) are removed by etching. In step 319 (photoresist removal step), unnecessary photoresist remaining after etching is removed. Multiple circuit patterns are formed by repetition of these preprocessing and post-processing steps.

While this invention has been described in terms of several preferred embodiments, there are alterations, permutations, and various substitute equivalents which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A wavefront aberration correction system for an adaptive optic having a light-reflecting surface, a back surface opposite thereto and a perimeter, said correction system comprising a plurality of correction units each comprising:
    an actuator disposed outside the perimeter of said adaptive optic;
    a force-applying member attached to the back surface of said adaptive optic at a specified position; and
    a force-communicating device connecting said actuator with said force-applying member.

2. The wavefront aberration correction system of claim 1 wherein said force-applying member comprises a flexure.

3. The wavefront aberration correction system of claim 1 wherein said force-communicating device is supported rotatably around a flexural pivot.

4. The wavefront aberration correction system of claim 1 wherein said force-communicating device comprises a lever supported rotatably around a pivot, said actuator applying an actuating force in a selected direction to said lever and thereby applying an aberration correcting force parallel to said selected direction to said specified position through said force-applying member.

5. The wavefront aberration correction system of claim 1 wherein said force-communicating device comprises a bell-crank supported rotatably around a pivot, said actuator applying an actuating force parallel to said back surface of said adaptive optic to one end portion of said bell-crank on one side of said pivot and thereby applying an aberration correcting force perpendicular to said back surface of said adaptive optic to said specified position through said force-applying member connected to another end portion of said bell-crank on the opposite side of said pivot.

6. A method of correcting wavefront aberration of an adaptive optic, said adaptive optic having a light-reflecting surface, a back surface opposite thereto and a perimeter, said method comprising the steps of:
    attaching a plurality of force-applying members to the back surface of said adaptive optic;
    positioning actuators outside the perimeter of said adaptive optic, each of said actuators being associated with a different one of said force-applying members;
    providing force-communicating devices each connecting one of said force-applying members with an associated one of said actuators; and
    controlling said actuators to correct wavefront aberration of said adaptive optic.

7. The method of claim 6 wherein said force-applying member comprises a flexure.

8. The method of claim 6 wherein said force-communicating device is supported rotatably around a flexural pivot.

9. The method of claim 6 wherein said force-communicating device comprises a lever supported rotatably around a pivot, said actuator applying an actuating force in a selected direction to said lever and thereby applying an aberration correcting force parallel to said selected direction to said specified position through said force-applying member.

10. The method of claim 6 wherein said force-communicating device comprises a bell-crank supported rotatably around a pivot, said actuator applying an actuating force parallel to said back surface of said adaptive optic to one end portion of said bell-crank on one side of said pivot and thereby applying an aberration correcting force perpendicular to said back surface of said adaptive optic to said specified position through said force-applying member connected to another end portion of said bell-crank on the opposite side of said pivot.

11. An EUV system comprising:

an EUV radiation source;

a reticle stage arranged to retain a reticle;

a working stage arranged to retain a workpiece; and an optical system including at least one adaptive optic with a wavefront aberration correction system therefor;

wherein said wavefront aberration correction system comprises a plurality of correction units each comprising:

an actuator disposed outside the perimeter of said adaptive optic;

a force-applying member attached to the back surface of said adaptive optic at a specified position; and a force-communicating device connecting said actuator with said force-applying member.

12. An object manufactured with the EUV system of claim 11.

13. A wafer on which an image has been formed by the EUV system of claim 11.

14. A method for making an object using a lithography process, wherein the lithography process utilizes an EUV system as recited in claim 11.

15. A method for patterning a wafer using a lithography process, wherein the lithography process utilizes an EUV system as recited in claim 11.

* * * * *

UNITED STATES PATENT AND TRADEMARK OFFICE
CERTIFICATE OF CORRECTION

PATENT NO. : 6,803,994 B2
DATED : October 12, 2004
INVENTOR(S) : Christopher S. Margeson It is certified that error appears in the above-identified patent and that said Letters Patent is hereby corrected as shown below:

<u>Column 6,</u>
Line 21, change "EUW light" to -- EUV light --.

Signed and Sealed this

Fifteenth Day of February, 2005

JON W. DUDAS
*Director of the United States Patent and Trademark Office*